United States Patent [19]

Wisbey

[11] 3,857,115

[45] Dec. 24, 1974

[54] SEMICONDUCTOR DEVICE MOUNTING ARRANGEMENTS

[75] Inventor: Philip Henry Wisbey, Braintree, England

[73] Assignee: The Marconi Company Limited, Chelmsford, Essex, England

[22] Filed: May 30, 1972

[21] Appl. No.: 257,679

[52] U.S. Cl. .............................. 333/84 M, 333/98 R

[51] Int. Cl. .............................. H01p 3/00

[58] Field of Search ...... 333/7 D, 98 S, 84 M, 84 R, 333/21 R, 21 A; 329/161; 317/101 CP

[56] References Cited

UNITED STATES PATENTS

| | | | |
|---|---|---|---|
| 3,328,730 | 6/1967 | Dowdell | 333/7 D |
| 3,517,272 | 6/1970 | Lee | 333/84 M |
| 3,541,460 | 11/1970 | Socci | 329/161 |
| 3,553,610 | 5/1969 | Brenner | 329/161 |
| 3,588,741 | 6/1971 | Glance | 333/84 M |
| 3,651,434 | 3/1972 | McGeough | 317/101 CP |
| 3,732,508 | 5/1973 | Ito et al. | 333/84 M |

OTHER PUBLICATIONS

Elsevier's Dictionary of Electronics and Waveguides, Elsevier Publishing Co., 2nd Edition, 1966, page 671.

*Primary Examiner*—Benedict V. Safourek
*Assistant Examiner*—Aristotelis M. Psitos
*Attorney, Agent, or Firm*—Baldwin, Wight & Brown

[57] ABSTRACT

An arrangement for mounting a semiconductor device in a waveguide run consists of a conducting block having an aperture between two of its faces, in which the device to be mounted is positioned. On one face of the block is provided a strip-line which extends towards the aperture and with which one terminal of the semiconductor device makes contact, the other terminal of the semiconductor making contact with the conducting surface of the block. The block is usually made from insulating material which is coated with and adherent metallic film the strip-line being defined by a photolithographic process.

13 Claims, 4 Drawing Figures

SEMICONDUCTOR DEVICE MOUNTING ARRANGEMENTS

This invention relates to semiconductor device mounting arrangements and more particularly to such mountings for use with high frequency microwave waveguides.

In high frequency microwave waveguides the use of active semiconductor devices is complicated by the presence of parasitic reactances associated with the package encapsulation of the device. The main factors which contibute to these parasitic reactances are the inductance associated with wire connections to the device and the capacitance of ceramic spacers (which are usually encountered in semiconductor device encapsulations).

The present invention seeks to reduce the parasitic reactances associated with the mounting of two terminal semiconductor devices in waveguides.

According to this invention a semiconductor device mounting arrangement for mounting in a waveguide run comprises a conductive block having an aperture extending between two of its faces, a strip-line provided on one of said two faces and extending towards said aperture and a semiconductor device one terminal of which is connected to a conductive surface of said block and a second terminal of which is connected to said strip-line.

In one embodiment of the invention the conductive surface to which said one terminal is connected is on the other of said two faces. In another embodiment of the invention the conductive surface to which said one terminal is connected is on said one face on which said strip-line is provided.

Preferably said block is an apertured insulating block provided with an adherent metallic film parts of which are removed to form said strip-line, in which case during manufacture preferably the apertured insulating block is completely coated with a metallic film by an electroless plating technique and a photolithographic process is utilised to remove unwanted areas of film. An abrasive process is also suitable for removing unwanted areas of film.

Preferably said strip-line extends to the edge of said aperture and a small gap is provided in the metallic film within said aperture surrounding the end of said strip-line so as to provide an r.f. bypass capacitor acting to reduce loss of r.f. power into said strip-line during operation.

Preferably said conductive block is recessed to accomodate the connections to the semiconductor device so that these do not protrude beyond the surface of said conductive block. Preferably again said two faces are each provided with a thin protective layer of insulating material, e.g., mica.

Figure 1:
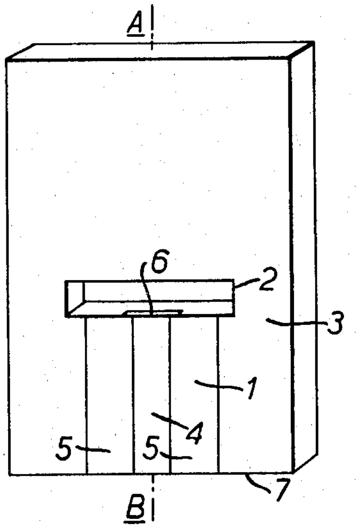
Figure 2:
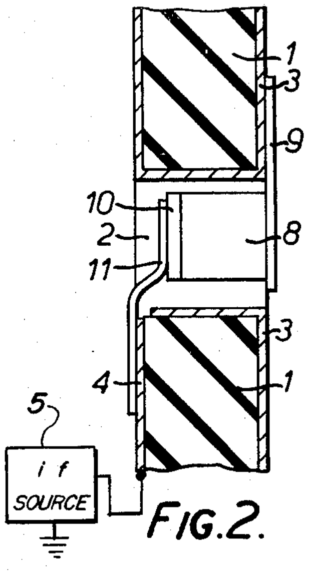
Figure 3:
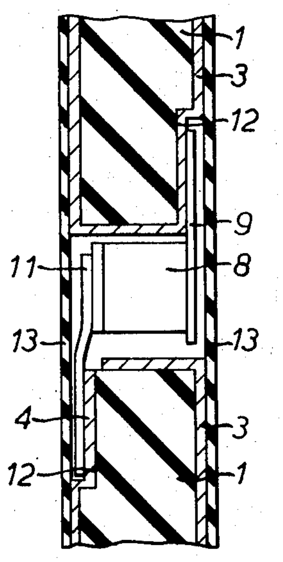
Figure 4:
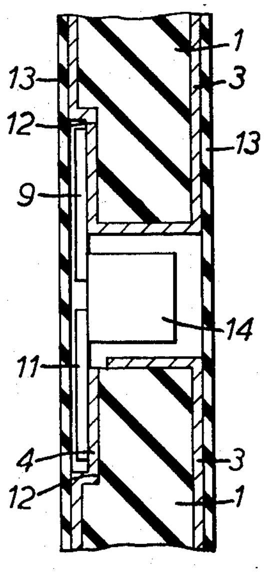

The invention is illustrated in and further explained in connection with the accompanying drawings in which FIG. 1 illustrates a waveguide section in accordance with the invention and FIGS. 2, 3 and 4 are sectional views (each showing the section AB of FIG. 1) of different mounting arrangements in accordance with the invention.

Referring to FIG. 1, a block 1 of insulating material, having an aperture 2 formed by ultrasonic drilling and extending between two of its faces, is completely coated with an adherent metallic film 3 by an electroless plating technique. A strip-line 4 is then formed on one of the said two faces of the block 1 by removing the film 3 to expose the insulating material of the block 1 in the areas 5 by a photolithographic technique. Strip-line 4 extends from the lower (as viewed) edge of the one face of the block the aperture 2. A portion of film is also removed within the aperture 2 to leave a small gap 6 between the end of the strip-line 4 and the metallic film on the inner surface of the waveguide aperture 2, thus producing an r.f. bypass capacitor which reduces the loss of microwave power from the waveguide section into the strip-line 4 during operation. Any metal on the base (as viewed) 7 of the block 1 is removed by grinding.

Referring now to FIG. 2, a two terminal semiconductor device 8 has one terminal attached to a metal foil 9 which is attached by thermocompression bonding to the metallic film 3 on the second of the two faces between which aperture 2 extends. The second terminal 10 of the device 8 is attached to a further metal foil 11 which is attached by thermocompression bonding to the strip-line 4.

Referring to FIG. 3, in this embodiment, which is otherwise similar to that shown in FIG. 2, of the invention a recess 12 is provided in the block 1 where the foil 9 is bonded to the metallic film 3 and where the foil 11 is bonded to the strip-line 4. This gives a certain amount of protection to the mounting arrangement but added protection is given by a thin mica film 13 on each of the faces of the waveguide section between which the aperture 2 extends.

Referring to FIG. 4, the mounting arrangement illustrated therein is similar to that described with reference to FIG. 3, except that the connection between the foil 9 and the metallic film 3 is on the same face of the waveguide section as the connection between the foil 11 and the strip-line 4.

It will be apparent that the strip-line 4 forms a bias or intermediate frequency input connection from an i.f. source S to the semiconductor device, and that other intermediate frequency circuitry may be fabricated on the block 1 as though the strip-line 4 were a conventional strip-line. For example, the strip-line 4 may have projections extending into the areas 5 acting as r.f. blocking filters.

Conveniently the mounting arrangement may be constructed as a plug-in unit adapted to plug into a length of waveguide in which the semiconductor device is required.

I claim:

1. A waveguide component assembly comprising, in combination:

an insulating block having opposite side surfaces and an aperture therethrough extending between said side surfaces and defining a waveguide portion, at least one of said side surfaces being electrically conductive;

a semiconductor device disposed within said waveguide portion, said semiconductor device having first and second terminals for connection to input signals operative to modify microwave energy guided through said aperture;

a strip-line on a side surface of the block and electrically isolated from said conductive side surface thereof; and electrical connector means for electrically connecting said first terminal of the semiconductor device to said strip-line and for electrically connecting said second terminal of the semiconductor device to said conductive side surface of the block.

2. An arrangement as claimed in claim 1 and wherein the conductive surface to which said second terminal is connected is on that side surface opposite said strip-line.

3. An arrangement as claimed in claim 1 and wherein the conductive surface to which said one terminal is connected is on that side surface on which said strip-line is provided.

4. An arrangement as claimed in claim 1 and wherein said insulating block is provided with an adherent metallic film parts of which are removed to form said strip-line.

5. An arrangement as claimed in claim 4 and wherein said strip-line extends to the edge of said aperture and a small gap is provided in the metallic film within said aperture surrounding the end of said strip-line so as to provide an r.f. by-pass capacitor acting to reduce loss of r.f. power into said strip-line during operation.

6. An arrangement as claimed in claim 1 and wherein said block is recessed to accomodate the connections to the semiconductor device so that these do not protrude beyond the surface of said conductive block.

7. An arrangement as claimed in claim 6 and wherein said opposite side surfaces are each provided with a thin protective layer of insulating material.

8. A circuit arrangement as claimed in claim 1 and including means for applying intermediate frequency input signals or d.c. bias to said strip-line.

9. In a microwave circuit, the combination of:

an insulating block having opposite side surfaces and provided with an aperture through said surfaces and of a cross-sectional area defining a wageguide portion for guiding microwave energy; and a strip-line circuit associated with said block for modifying microwave energy in said aperture; said strip-line circuit comprising a strip-line on one of said side surfaces of the block and leading to said aperture, the internal surface of said block defining said aperture being electrically conductive except for a portion thereof defining an rf by-pass capacitor with said strip-line, a semiconductor device within said aperture and having a pair of terminals, and strip conductor means for respectively connecting one terminal of said semiconductor device to said strip-line and the other terminal of said semiconductor to said conductive internal surface of said block.

10. In a microwave circuit as defined in claim 9 wherein said insulating block is provided with an adherent metallic film parts of which are removed to form said strip-line.

11. In a microwave circuit as defined in claim 9 wherein said strip conductor means comprises a first strip and a second strip disposed at the same end of said aperture.

12. In a microwave circuit as defined in claim 9 wherein said strip conductor means comprises a first strip and a second strip disposed at opposite ends of said aperture.

13. A combined wageguide component-stripline circuit assembly comprising, in combination;

an insulating block having an aperture therethrough defining a waveguide portion guiding microwave energy, at least a portion of the internal surface of said block which defines said aperture having a metallic film thereon forming part of said strip-line circuit;

semiconductor means disposed within said aperture for modifying microwave energy in said aperture and having a pair of terminals;

a metallic strip electrically connecting one of said pair of terminals to said metallic film;

a stripline on said block extending transverse to the axis of said aperture and leading thereto;

a second metallic strip electrically connecting the other terminal of said semiconductor means to said stripline, the metallic strip first mentioned and said second metallic strip serving also to locate and support said semiconductor means in said aperture; and r.f. by-pass capacitor means formed between said metallic film within the aperture and that end of said stripline adjacent said aperture for reducing loss of microwave power from said waveguide portion into said stripline.

* * * * *